(12) United States Patent
Robertson

(10) Patent No.: US 11,283,308 B2
(45) Date of Patent: Mar. 22, 2022

(54) METHODS FOR DETECTING AND IDENTIFYING A RECEIVER IN AN INDUCTIVE POWER TRANSFER SYSTEM

(71) Applicant: Apple Inc., Cupertino, CA (US)

(72) Inventor: Daniel James Robertson, Freemans Bay (NZ)

(73) Assignee: Apple Inc., Cupertino, CA (US)

( * ) Notice: Subject to any disclaimer, the term of this patent is extended or adjusted under 35 U.S.C. 154(b) by 94 days.

(21) Appl. No.: 16/819,334

(22) Filed: Mar. 16, 2020

(65) Prior Publication Data
US 2020/0220393 A1 Jul. 9, 2020

Related U.S. Application Data

(63) Continuation of application No. 15/493,857, filed on Apr. 21, 2017, now Pat. No. 10,601,264, which is a
(Continued)

(51) Int. Cl.
*H01F 38/00* (2006.01)
*H02J 50/90* (2016.01)
(Continued)

(52) U.S. Cl.
CPC .............. *H02J 50/90* (2016.02); *G01R 19/04* (2013.01); *G01R 19/15* (2013.01);
(Continued)

(58) Field of Classification Search
CPC . H02J 50/90; H02J 50/10; H02J 50/12; G01R 19/04; G01R 19/15; G01R 27/2611
(Continued)

(56) References Cited

U.S. PATENT DOCUMENTS

| | | | |
|---|---|---|---|
| 4,960,983 A | 10/1990 | Inoue | |
| 5,536,979 A | 7/1996 | McEachern | |

(Continued)

FOREIGN PATENT DOCUMENTS

| | | |
|---|---|---|
| CN | 1954472 A | 4/2007 |
| CN | 101459352 A | 6/2009 |

(Continued)

OTHER PUBLICATIONS

Therimawithana, et al., "Analysis of Split-Capacitor Push-Pull Parallel-Resonant converter in Boost Mode," IEEE Transactions on Power Electronics, vol. 23, No. 1, 2008.
(Continued)

*Primary Examiner* — Rexford N Barnie
*Assistant Examiner* — Dru Parries
(74) *Attorney, Agent, or Firm* — Fletcher Yoder PC

(57) ABSTRACT

A method for detecting the presence of a receiver in an inductively coupled power transfer system having a transmitter and receiver. The method includes switching on a transmitter converter at a first frequency, measuring the inrush current and determining whether there is a receiver present. In another method, the inrush current is measured for a range of transmitter frequencies, and the variation in current is used to determine where there is a receiver present. In another method, the inrush current is measured when there is a change in voltage in the transmitter, and the variation in current is used to determine where there is a receiver present. In another method, the current supplied to the transmitter converter is measured over two transmitter frequencies, and the variation in current is used to determine where there is a receiver present. In another method, the current supplied to the transmitter converter is measured over two transmitter voltages, and the variation in current is used to determine where there is a receiver present.

30 Claims, 4 Drawing Sheets

Related U.S. Application Data continuation of application No. 14/398,187, filed as application No. PCT/NZ2013/000068 on Apr. 15, 2013, now Pat. No. 9,696,358.

(60) Provisional application No. 61/696,341, filed on Sep. 4, 2012.

(51) Int. Cl.
  *H02J 50/10* (2016.01)
  *H02J 7/02* (2016.01)
  *H02J 50/12* (2016.01)
  *G01R 27/26* (2006.01)
  *G01R 19/04* (2006.01)
  *G01R 19/15* (2006.01)

(52) U.S. Cl.
  CPC .......... *G01R 27/2611* (2013.01); *H02J 7/025* (2013.01); *H02J 50/10* (2016.02); *H02J 50/12* (2016.02)

(58) Field of Classification Search
  USPC ........................................................ 307/104
  See application file for complete search history.

(56) References Cited

U.S. PATENT DOCUMENTS

| | | | |
|---|---|---|---|
| 6,219,267 | B1 | 4/2001 | Andres |
| 6,803,744 | B1 | 10/2004 | Sabo |
| 7,064,613 | B2 | 6/2006 | Kolsrud |
| 7,164,255 | B2 | 1/2007 | Hui |
| 7,495,414 | B2 | 2/2009 | Hui |
| 8,766,487 | B2 * | 7/2014 | Dibben ................ H01F 38/14 307/104 |
| 2003/0169013 | A1 | 9/2003 | Kadah |
| 2003/0214821 | A1 | 11/2003 | Giannopoulos |
| 2005/0068019 | A1 | 3/2005 | Nakamura |
| 2007/0131505 | A1 | 6/2007 | Kim |
| 2007/0182367 | A1 | 8/2007 | Partovi |
| 2007/0228833 | A1 | 10/2007 | Stevens |
| 2007/0296393 | A1 | 12/2007 | Malpas |
| 2009/0001941 | A1 | 1/2009 | Hsu |
| 2009/0174264 | A1 | 7/2009 | Onishi |
| 2010/0084918 | A1 | 4/2010 | Fells |
| 2010/0187912 | A1 | 7/2010 | Kitamura |
| 2010/0244577 | A1 | 9/2010 | Shimokawa |
| 2010/0259217 | A1 | 10/2010 | Baarman |
| 2010/0314946 | A1 | 12/2010 | Budde |
| 2011/0062793 | A1 | 3/2011 | Azancot |
| 2011/0089768 | A1 | 4/2011 | Byrne |
| 2011/0196544 | A1 | 8/2011 | Baarman |
| 2012/0077537 | A1 | 3/2012 | Muratov |
| 2013/0030892 | A1 | 1/2013 | Liu |
| 2013/0119773 | A1 | 5/2013 | Davis |
| 2014/0009178 | A1 | 1/2014 | Bai |
| 2014/0015329 | A1 | 1/2014 | Widmer |
| 2014/0091634 | A1 | 4/2014 | Mayo |
| 2014/0091755 | A1 | 4/2014 | Walley |
| 2014/0197687 | A1 | 7/2014 | Lin |

FOREIGN PATENT DOCUMENTS

| | | |
|---|---|---|
| CN | 102386682 A | 3/2012 |
| CN | 103782485 A | 5/2014 |
| EP | 1022840 A1 | 7/2000 |
| EP | 2017940 A2 | 1/2009 |
| EP | 2602908 A1 | 6/2013 |
| EP | 3127215 A1 | 2/2017 |
| JP | H01157896 A | 6/1989 |
| JP | 2003263668 A | 9/2003 |
| JP | 2005345435 A | 12/2005 |
| JP | 2009112137 A | 5/2009 |
| JP | 2009118587 A | 5/2009 |
| JP | 2010515425 A | 5/2010 |
| JP | 2010136463 A | 6/2010 |
| JP | 2010136464 A | 6/2010 |
| JP | 2010239690 A | 10/2010 |
| JP | 2010532712 A | 10/2010 |
| JP | 2010538596 A | 12/2010 |
| JP | 2011193671 A | 9/2011 |
| JP | 2012175793 A | 9/2012 |
| JP | 2012533277 A | 12/2012 |
| JP | 2013542424 A | 11/2013 |
| JP | 2014027102 A | 2/2014 |
| JP | 2014126512 A | 7/2014 |
| JP | 2014526871 A | 10/2014 |
| JP | 2014222994 A | 11/2014 |
| JP | 2015046990 A | 3/2015 |
| JP | 2015136281 A | 7/2015 |
| KR | 20080094953 A | 10/2008 |
| WO | 8910030 A1 | 10/1989 |
| WO | 1997042695 A1 | 11/1997 |
| WO | 2005109597 A1 | 11/2005 |
| WO | 2005109598 A1 | 11/2005 |
| WO | 2008026080 A1 | 3/2008 |
| WO | 2008137996 A1 | 11/2008 |
| WO | 2009027674 A1 | 3/2009 |
| WO | 2009041058 A1 | 4/2009 |
| WO | 2009081115 A1 | 7/2009 |
| WO | 2009081126 A1 | 7/2009 |
| WO | 2011118371 A1 | 9/2011 |
| WO | 2013122483 A1 | 8/2013 |
| WO | 2013179394 A1 | 12/2013 |
| WO | 2014011776 A2 | 1/2014 |
| WO | 2014060871 A1 | 4/2014 |
| WO | 2014083015 A1 | 6/2014 |
| WO | 2014095722 A2 | 6/2014 |

OTHER PUBLICATIONS

Wu, et al., "A Series-Tuned Inductive-Power-Transfer Pickup With a Controlloable AC-Voltage Output," IEEE Translations on Power Electronics, vol. 26, No. 1, 2011.

Zou, et al., "A new rectifier with combined power flow control capability for a series-tuned inductive-power-transfer Yeceiver," IEEE International Conf, on Power System Technology (POWERCON), 2012.

\* cited by examiner

_METHODS FOR DETECTING AND IDENTIFYING A RECEIVER IN AN INDUCTIVE POWER TRANSFER SYSTEM_

This application is a Continuation of U.S. Ser. No. 15/493,857, filed 21 Apr. 2017, which is a Continuation of U.S. Ser. No. 14/398,187, filed 31 Oct. 2014, which is a National Stage Application of PCT/NZ2013/000068, filed 15 Apr. 2013, which claims benefit of Serial No. 599740, filed 2 May 2012 in New Zealand and Ser. No. 61/696,341, filed 4 Sep. 2012 in the United States and which applications are incorporated herein by reference. To the extent appropriate, a claim of priority is made to each of the above disclosed applications.

FIELD OF THE INVENTION

The present invention is in the field of inductive power transfer (IPT) system. More particularly, the invention relates to methods for detecting the presence of a receiver, and or identifying a receiver, to be utilised in such systems.

BACKGROUND OF THE INVENTION

IPT systems are a well known area of established technology (for example, wireless charging of electric toothbrushes) and developing technology (for example, wireless charging of handheld devices on a 'charging mat'). Typically, a primary side or transmitter generates a time-varying magnetic field with a transmitting coil or coils. This magnetic field induces an alternating current in a suitable receiving coil that can then be used to charge a battery, or power a device or other load. In some instances, the transmitter coils or the receiver coils may be connected with capacitors to create a resonant circuit, which can increase power throughput and efficiency at the corresponding resonant frequency.

A common problem with IPT systems is controlling when the transmitter should be powered and when the transmitter should be switched off. A further problem arises when a non-receiver is brought into the range of the transmitter, and an unwanted current (and therefore heat) is induced therein. These non-receivers are typically known as parasitic loads. Lastly, it may be possible to detect the presence of a receiver, but it may also be necessary to identify the receiver as being compatible with the particular transmitter. Attempting to transfer power to non-compatible receivers may result in inefficient power transfer (thus, undesired energy loss), or transmitter and/or receiver failure.

An obvious solution to the problems outlined above is to include a manually operated power switch with the transmitter. Though this provides a means for controlling when the transmitter should be powered, it undermines the convenience that is a goal of many IPT systems. It also requires a user to manually switch off the transmitter when the receiver is removed and does not accommodate any parasitic loads that may be introduced into the vicinity of the transmitter without the user's knowledge.

Automatic systems for the detection and identification of receivers have been described in the prior art. For example:
- Systems that rely on contact-based interaction between the transmitter and receiver;
- Systems that rely on communication signals sent between the transmitter and receiver; and
- Systems that use non-radioproximity sensors (eg light sensors) to detect the physical presence of receivers.

All of these approaches rely on additional componentry to implement the detection method. This adds complexity and cost to the design of IPT systems. Perhaps more importantly, they tend to add bulk, which frustrates attempts to incorporate IPT systems into smaller devices such as mobile phones, personal computers and the like.

To lessen these effects, it is known for IPT systems to utilise the power transfer componentry for detection and identification as well (ie multi-purpose).

The drawbacks of these approaches are:
- The power transfer may need to be reduced or completely interrupted in order to carry out a detection method;
- Where steady-state current is used an indicator of a receiver, unloaded receivers may erroneously give a false result;
- May be sensitive to component variations and noise; and
- May be unable to identify whether a detected receiver is compatible.

It is an object of the invention to provide methods for detecting or identifying a receiver that do not require extensive additional componentry to that required for inductive power, that produce accurate results not sensitive to noise, that limit the time during which power is not being transferred, that can positively identify a receiver or to at least provide the public with a useful choice.

SUMMARY OF THE INVENTION

The scope of the invention is as set out in the accompanying claims at the end of this specification.

It is acknowledged that the terms "comprise", "comprises" and "comprising" may, under varying jurisdictions, be attributed with either an exclusive or an inclusive meaning. For the purpose of this specification, and unless otherwise noted, these terms are intended to have an inclusive meaning—i.e. they will be taken to mean an inclusion of the listed components which the use directly references, and possibly also of other non-specified components or elements.

Reference to any prior art in this specification does not constitute an admission that such prior art forms part of the common general knowledge.

BRIEF DESCRIPTION OF THE DRAWINGS

The accompanying drawings which are incorporated in and constitute part of the specification, illustrate embodiments of the invention and, together with the general description of the invention given above, and the detailed description of embodiments given below, serve to explain the principles of the invention.

DETAILED DESCRIPTION OF EMBODIMENTS OF THE INVENTION

Figure 1:
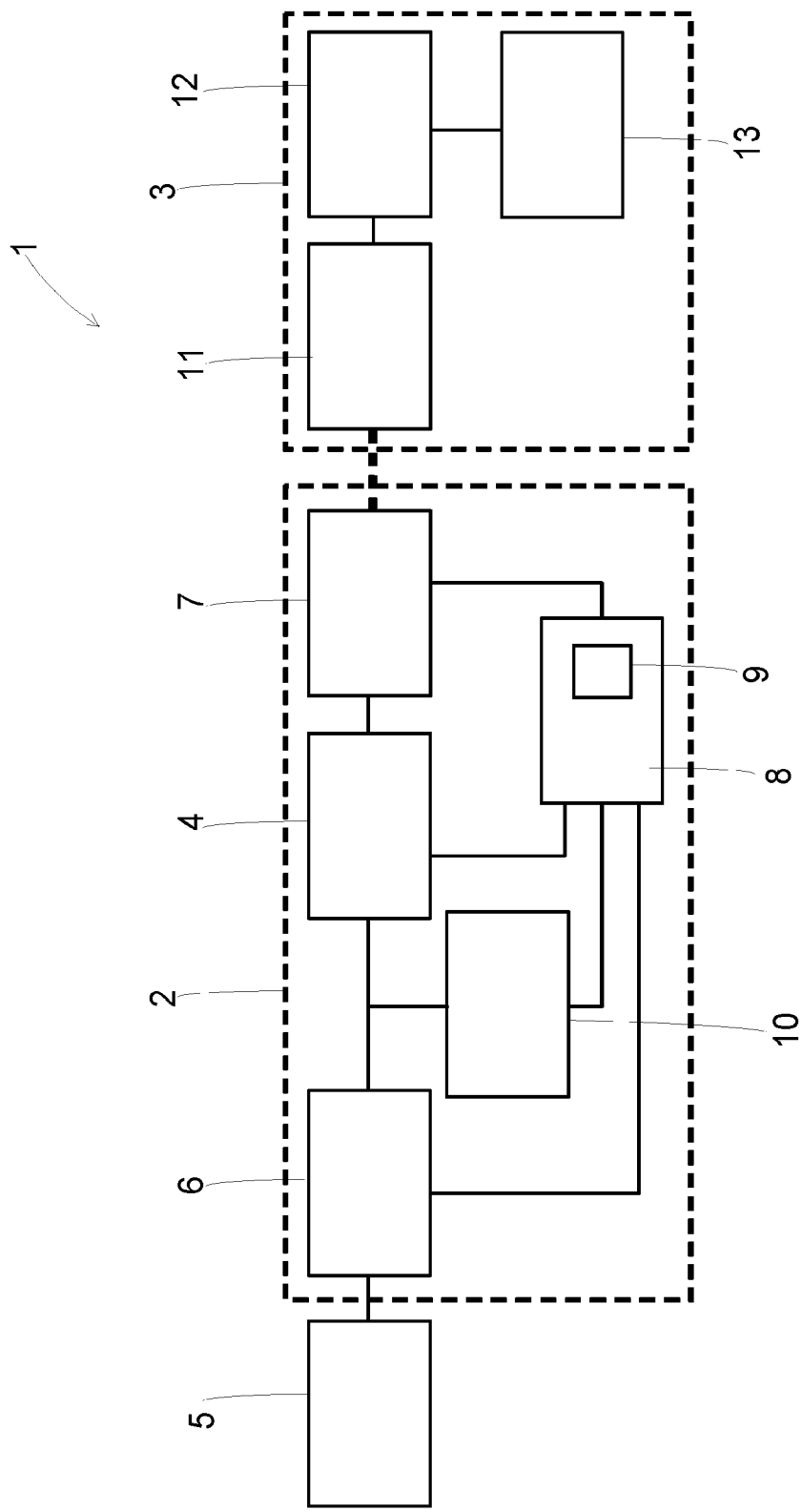
FIG. 1 shows a block diagram of an IPT system.

Embodiments of the present invention relate to methods for detecting or identifying a receiver in an inductive power transfer (IPT) system. FIG. 1 is a block diagram showing a general representation of an IPT system 1. The IPT system includes a transmitter 2 and a receiver 3. The transmitter includes a converter 4 that is connected to an appropriate power supply 5. In FIG. 1 this is shown as a converter that is connected to a DC-DC converter 6 that is in turn connected to the mains power supply. The converter may be a non-resonant half bridge converter or any other converter adapted for the particular IPT system, such as a push-pull converter. The converter is configured to output an alternating current of desired frequency and amplitude. The voltage of the output of the converter may also be regulated by the converter, the DC-DC converter or combination of both.

The converter 4 is connected to transmitting inductor(s) 7. The converter supplies the transmitting inductor(s) with an alternating current such that the transmitting inductor(s) generate a time-varying magnetic field with a suitable frequency and strength. In some configurations, the transmitting inductors can also be considered to be an integral part of the converter, but for the sake of clarity this description will refer to them as distinct.

The transmitting inductor(s) 7 may be a suitable configuration of coils, depending on the characteristics of the magnetic field that are required in a particular application and the particular geometry of the transmitter. In some IPT systems, the transmitting inductors may be connected to capacitors (not shown) to create a resonant circuit.

FIG. 1 also shows a controller 8 within the transmitter 2. The controller can be connected to each part of the transmitter. The controller is adapted to receive inputs from each part of the transmitter and produce outputs that control the way each part of the transmitter operates. The controller may include a memory 9. The controller is preferably a programmable logic controller that is programmed to perform different computational tasks depending on the requirements of the IPT system.

In addition to the features of a general IPT system 1 outlined above, FIG. 1 also shows a representation of a sensor 10. Such a sensor is adapted for sensing a particular operating characteristic of the transmitter 2 and may be connected to other parts of the transmitter accordingly. In FIG. 1, it is shown connected to the junction between the DC-DC converter 6 and the converter 4, which is appropriate for measuring the current being supplied to the converter. Of course, other sensors may be required and the invention is not limited in this respect.

In some embodiments of the invention described in more detail below, the sensor 10 is adapted to measure current. Those skilled in the art will appreciate that there are many possible types of sensors that are adapted for measuring current, and the invention is not limited in this respect. One example is a current sense resistor. It will be understood that an appropriate current sensor will be used that is able to measure the desired current characteristic dependent upon the required functionality. This will be discussed in more detail later.

FIG. 1 also shows a receiver 3. The receiver includes receiving inductor(s) 11 that are suitably connected to receiver circuitry 12 that in turn supplies power to a load 13. The load may be a battery. The receiver circuitry is adapted to convert the induced current into a form that is appropriate for the load. In some IPT systems, the receiving inductors may be connected to capacitors (not shown) to create a resonant circuit.

There will now be described five embodiments of methods for detecting and or identifying receivers in an IPT system, or for detecting conducting non-receivers. Though these methods will be described in relation to the IPT system 1 described in relation to FIG. 1, it will be understood that the methods may be adapted to work with any number of appropriate IPT system configurations, and similarly IPT systems may be adapted to work with these methods, and the invention is not limited in this respect.

Inrush Current Detection Method

According to one embodiment of the invention, the inrush current detection method begins with the transmitter in a standby mode. In this mode, the transmitter is controlled to draw minimum power. Periodically the transmitter switches from the standby mode to a detection mode to detect whether any receivers have come into the transmitting range of the transmitter. In a preferred embodiment of the invention, the transmitter is configured to temporarily switch into the detection mode every 2 seconds. Alternatively, the transmitter may already be in a detection mode if the inrush current detection method was preceded by another detection method.

Upon switching into a detection mode, the controller controls the converter so that it supplies the inductor with an initial high frequency alternating voltage. Where the IPT system has resonant networks, the frequency should be non-resonant. Such a current eliminates any residual DC biases that may be present in capacitors in the IPT system. Eliminating such biases improves the reliability of the subsequent steps of the method. Other methods may be used for eliminating DC biases in the system such as a voltage divider or a replacing the half bridge inverter with a full bridge inverter. In a preferred embodiment, the high frequency current is supplied for a sufficient time interval until a steady state has been reached. In one embodiment of the invention, this time period is of the order of ~10 ms.

In the next step, the controller controls the converter so that it supplies the inductor with an alternating current at a test frequency. In a preferred embodiment, this is a frequency that a receiver will have the strongest inrush. This frequency may be at or about the frequency at which the transmitter is configured to transmit power. Those skilled in the art will appreciate that this frequency is dependent on the circuit components used in the transmitter. For typical IPT systems, this can be from ~100 kHz-~1 MHz. In a preferred embodiment, the test frequency is, or near to, ~150 kHz.

Upon supplying the current at the test frequency, there will be an inrush period during which transient currents will flow through circuit components in the transmitter and any receiver that may be present. The existence of transient currents is a well-known phenomenon in circuits. However normally transient currents are ignored until the system reaches a steady state. Conversely, these transient currents form the basis of the inrush current detection method.

A sensor is configured for measuring the current supplied to the converter. As shown in FIG. 1, the sensor 10 may be connected at the junction between the converter 4 and the DC-DC converter 6. During the inrush period, the sensor measures the amplitude of the current being supplied to the converter. In one embodiment, the sensor measures the peak amplitude during the inrush period. In one embodiment, the sensor may include a peak amplitude detection circuit for this purpose. The controller may be configured to provide the inrush period as an input into the sensor. In an alternative embodiment, the sensor may measure the current amplitude continuously during the inrush period, with the measurements being provided as inputs into the controller, which is configured to determine the peak amplitude from this data.

The peak amplitude of the current is then provided to the controller. The controller is configured to determine whether the peak amplitude exceeds a threshold. If there is no receiver present, then the peak current will be that due to the transient current in the circuit components in the transmitter only. However, if there is a receiver present, then the peak current will typically be higher due to the transient currents in the receiver. Therefore, it is preferable that the threshold is selected so that it is higher than any peak currents that may be due to transmitter components only. Preferably, this is achieved by calibrating the controller having regard to the particular configuration of the transmitter. It is possible that non-receivers may also affect the magnitude of the peak current measured during the inrush period. Therefore, it may also be necessary to select the threshold so that it is high enough to exclude non-receivers, whilst still being low enough to ensure that transient currents in receivers cause the measured peak amplitude to exceed the threshold.

In one embodiment of the invention, the sensor may measure multiple peak currents during the inrush period. The sensor and or controller may be configured to disregard peaks that are characteristic of the transmitter. Again, this may be done through calibration of the sensor and or controller in light of the configuration of the transmitter.

If the measured peak current exceeds the threshold, then there is a likelihood that a receiver may be in the range of the transmitter, and thus the controller may then:

control the transmitter so that power is transferred to the receiver;

control the transmitter according to further detection methods to further verify the presence of a receiver; or control the transmitter according to further identification methods to identify the compatibility of a receiver with the transmitter.

If the measured peak current falls below the threshold, then there is a likelihood that a receiver may not be in the range of the transmitter, and thus the controller may then:

control the transmitter according to further detection methods to detect the presence of a receiver;

return the transmitter to the previously described standby mode; or switch the transmitter off Frequency Sweep Detection Method According to one embodiment of the invention, the frequency sweep detection method begins with the transmitter in a standby mode as described above under the inrush current detection method. Alternatively, the transmitter may already be in a detection mode if the frequency sweep detection method was preceded by another detection method.

Upon switching into a detection mode, the transmitter is controlled according to the inrush current detection method described above, up until the step when the peak amplitude of the current has been provided to the controller. Then, instead of determining whether the peak amplitude exceeds a threshold, the controller stores the peak amplitude in memory as well as the value of the test frequency.

Then, the transmitter is again controlled according to the inrush current detection method described above, up until the peak amplitude of the current has been provided to controller, however this time at a second test frequency. The controller stores the peak amplitude in memory as well as the value of the second test frequency.

The above step is repeated for a plurality of test frequencies over a range of frequencies. This results in the memory having a record of peak amplitude currents measured during the inrush period for a range of frequencies. In a preferred embodiment, the range of frequencies is selected so as to be generally centred about the frequency that a receiver will have the strongest inrush. This frequency may be at or about which the frequency at which the transmitter is configured to transmit power.

The controller then analyses the record to determine whether there is a maximum in the relationship between the peak amplitudes of the currents and test frequencies. The controller determines whether there is a maximum by any suitable method of function analysis.

Figure 2A:
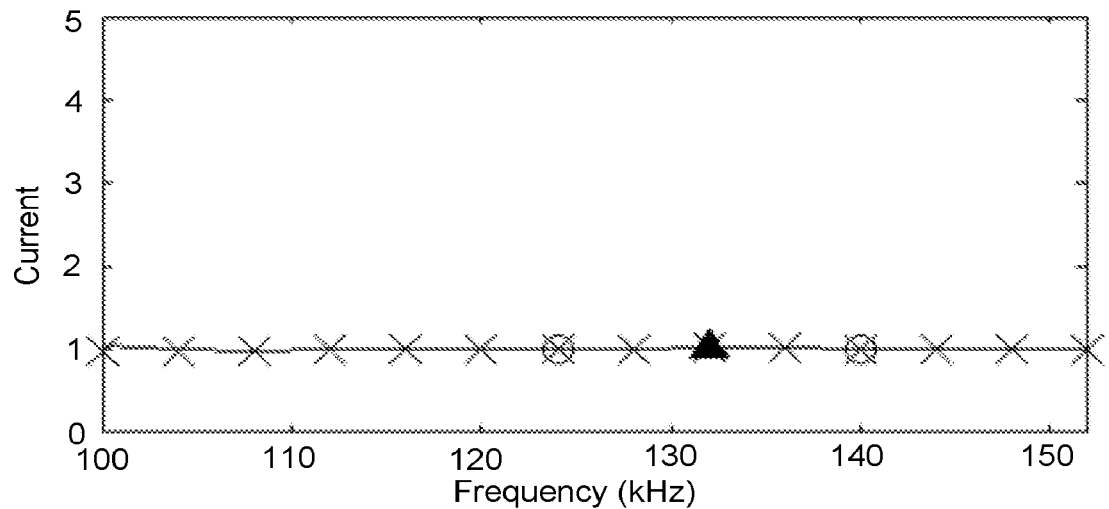
FIGS. 2a to 5 show sample data sets.
Figure 2B:
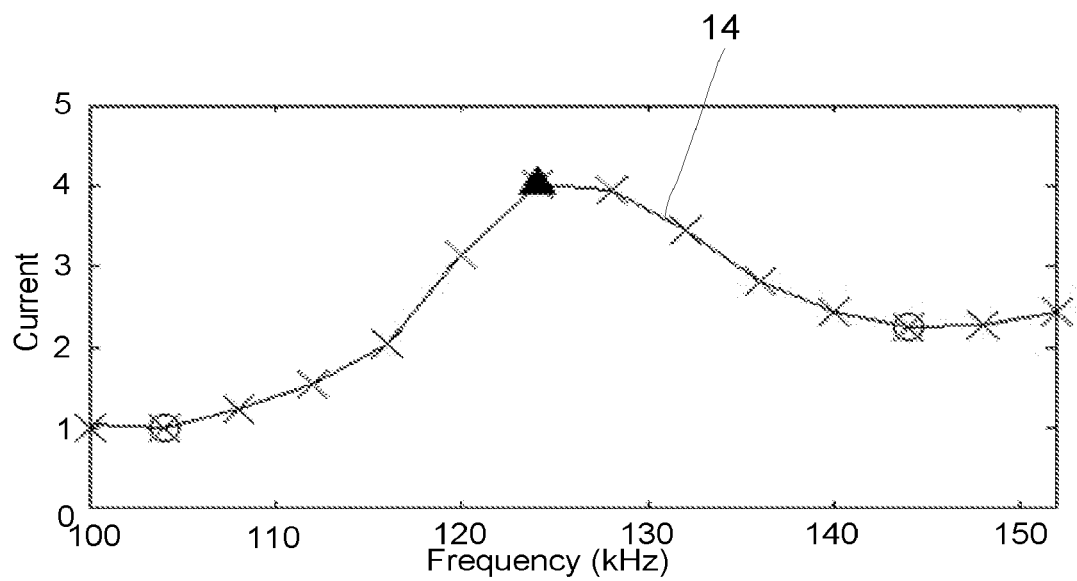

FIGS. 2a and 2b show two example sets of data. In the first data set in FIG. 2a, it can be seen that there is slight variation, but there is no discernible maximum. Conversely, the second data set in FIG. 2b shows a discernible maximum 14. The controller may be configured to determine that there is a maximum only if it is sufficiently large in the context of the data set as a whole, such as that illustrated by the second data set in FIG. 2b (ie not necessarily a maximum in the strict mathematical sense).

Figure 3:
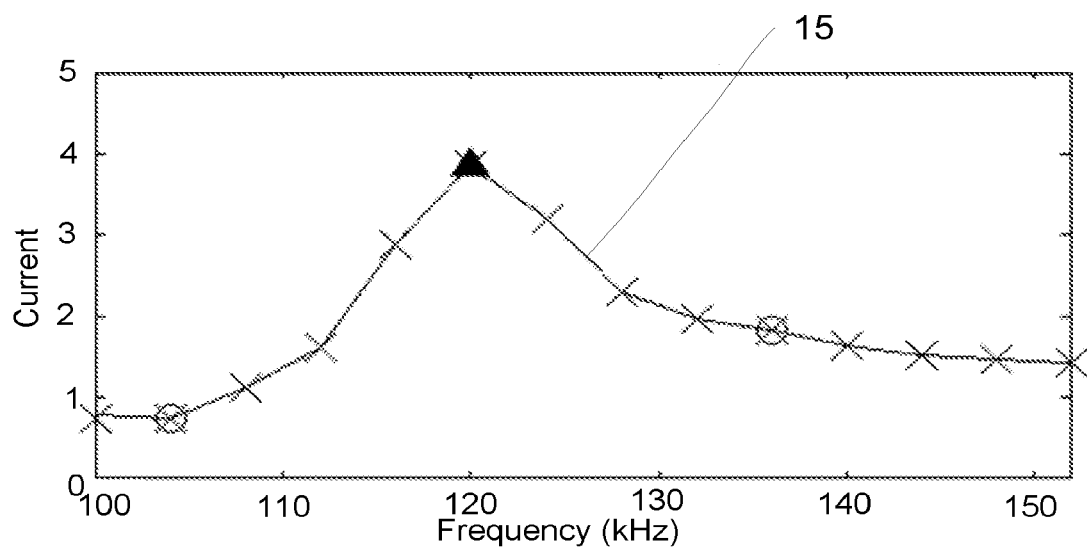

The controller then determines parameters associated with the maximum. This can include determining the width of the maximum (such as the full-width half-maximum metric), the height of the maximum and the frequency at which the maximum occurs. Again, those skilled in the art will appreciate that any suitable method of function analysis can be adapted and used by the controller for this purpose. The controller may smooth or average results to improve the reliability of the analysis. Referring to FIG. 3, there is shown another data set that exhibits a maximum 15. In this instance, the maximum has a width of 32 kHz, a height of 2.0, and occurs at 120 kHz.

In one embodiment, the analysis of the maximum may include the following:

Subtract the baseline data from the measured data, so that any result is as compared to a baseline;

Smooth and filter noise by conducting moving average of width three (or similar) on the data points;

Locate the edges of the maximum by finding where the slope changes polarity;

Locate the top of the maximum by finding the largest value between the edges of the maximum;

Measure the height at the edges of the maximum;

Maximum width may be defined as the width between the maximum's edges; and

Maximum height may be defined as the vertical distance from the height at the higher of the maximum edges to the height at the top of the peak.

If a receiver is present, then a maximum will result that exhibits some or all of these characteristics. For example, a resonant receiver will cause a maximum to occur at the resonant frequency of the receiver, since more transient current will flow when the transmitter is coupled with a receiver that is resonating. Further the frequency at which the maximum occurs may identify the type of receiver. For example, the receiver that causes the maximum in FIG. 3 to be produced is configured to be resonant at 120 kHz. Since the resonant frequency of a receiver can be unique to a type of receiver, the controller may be able to identify whether the receiver is compatible with the transmitter. In other words, the maximum can be a resonance 'signature'. Thus, it will be understood that the frequency sweep detection method may be a method for detecting a receiver, but may also be for identifying a receiver.

The controller includes predetermined parameters against which it compares the parameters of the maximum. For example, the predetermined parameters may provide that the maximum must have or exceed a certain width and or a certain height, and or must occur at a certain frequency, frequencies or within a frequency range.

If the controller determines that the parameters of the maximum satisfy the predetermined parameters, then there is a likelihood that a receiver (detected) or compatible receiver (identified) may be in the range of the transmitter, or that a previously detected receiver may be compatible with the transmitter. Thus the controller may then:

control the transmitter so that power is transferred to the receiver;

control the transmitter according to further detection methods to further verify the presence of a receiver; or control the transmitter according to further identification methods to further identify the compatibility of a receiver with the transmitter.

If the controller determines that the parameters of maximum do not satisfy the predetermined parameters or determines that there is no maximum, then there is a likelihood that a receiver may not be in the range of the transmitter or that a receiver may not be compatible with the transmitter. Thus, the controller may then:

control the transmitter according to further detection methods to detect the presence of a receiver;

return the transmitter to the previously described standby mode; or switch the transmitter off Inrush Current Removal Detection Method According to one embodiment of the invention, the inrush current removal detection method begins with the transmitter in a power mode. In one embodiment, the transmitter has already detected the presence of a receiver and has commenced transferring power to the receiver. In the power mode, the transmitter is controlled to transfer power to a receiver. The converter and DC-DC converter will be controlled to supply an alternating current to the inductor at an operating frequency and an operating voltage.

Periodically the transmitter switches from the power mode to a power-detection mode (ie a mode for detecting receivers or parasitic loads whilst transferring power) to detect whether the receiver has been removed from the range of the transmitter. In a preferred embodiment of the invention, the transmitter is configured to temporarily switch into the power-detection mode every 2 seconds. Upon switching into a power-detection mode, the controller controls the converter or DC-DC converter so that the inductor is supplied with a slightly lower voltage. The lower voltage should not be so small as to affect the rated power transfer from the transmitter to the receiver. In one embodiment, the smaller voltage is less than 4% smaller than the operating voltage. The system is then allowed to reach a steady state under the smaller voltage.

Next, the controller controls the converter or DC-DC converter so that the inductor is supplied with a higher voltage. The higher voltage should not be so high as to affect the rated power transfer from the transmitter to the receiver. In one embodiment, the higher voltage is less than 4% higher than the operating voltage. The higher voltage may be the operating voltage.

Increasing the voltage in this way will result in an inrush period, and transient currents will flow in circuit components present in the system. The transmitter measures the peak amplitude of the current being supplied to the converter as per the inrush current detection method, described above. The controller also determines whether the peak amplitude of the current exceeds a threshold according to the inrush current detection method, described above Those skilled in the art will appreciate that the thresholds, time periods and characteristic peaks described in relation to the inrush current detection method may need to be modified to account for the fact the inrush current removal detection method is undertaken during power transfer.

If the measured peak current exceeds the threshold, then there is a likelihood that a receiver may still be in the range of the transmitter, and thus the controller may then:

control the transmitter so that power is transferred to the receiver, which may include returning the voltage of the transmitter to the operating voltage.

If the measured peak current falls below the threshold, then there is a likelihood that a receiver may no longer be in the range of the transmitter, and thus the controller may then:

control the transmitter according to further detection methods to confirm the absence of the receiver;

return the transmitter to the previously described standby mode; or switch the transmitter off.

In another embodiment of the inrush current removal detection method, rather than initially decrease the voltage to a smaller voltage, the voltage can be increased to a higher voltage, and the inrush current measured at this stage. In this embodiment, the higher voltage should not be so high as to affect the power transfer from the transmitter to the receiver. In one embodiment, the higher voltage is less than 4% higher than the operating voltage.

In another embodiment of the inrush current removal detection method, rather than initially decrease the voltage to a smaller voltage, the voltage is decreased to zero for a first test period and then returned to the operating voltage. Upon increasing the voltage back to the operating voltage the inrush current measured is measured according to the above description.

The first test period is short enough such that switching the voltage to zero does not affect power transfer from the transmitter to the receiver, particularly where the receiver is under load. In one embodiment of the invention the first test period is ~10 us. Such a short test period may not allow the DC voltages in the receiver to decay sufficiently to measure a resultant transient current. So the test is repeated over a series of increasing test periods up until a second test period, when there are resultant transient currents that are able to be measured. Alternatively, if no transient currents are detected at the second test period then it is determined that no receiver is present. Gradually increasing the test period in this way, allows the inrush period to be observed for the shortest 'off-time' (ie zero voltage) necessary, and thus where the receiver is under load, power transfer will not be interrupted.

Frequency Vary Detection Method.

According to one embodiment of the invention, the frequency vary detection method begins with the transmitter in a power mode. In one embodiment, the transmitter has already detected the presence of a resonant receiver and has commenced transferring power to the resonant receiver. In the power mode, the transmitter is controlled to transfer power to a resonant receiver. The converter and DC-DC converter will be controlled to supply an alternating current to the inductor at an operating voltage and an operating frequency, wherein the operating frequency is controlled to match the resonance of the receiver.

Periodically the transmitter switches from the power mode to a power-detection mode to detect whether a conducting non-receiver (ie a parasitic load has been introduced into the range of the transmitter. In a preferred embodiment of the invention, the transmitter is configured to temporarily switch into the power-detection mode every 2 seconds.

Upon switching into a power-detection mode, the sensor measures the average steady state current being supplied to the converter. The controller stores this current value in memory as well as the value of the frequency.

The controller then adjusts the frequency to a test frequency. The test frequency should be sufficient close to the operating frequency as to not allow the receiver to fall out of resonance, and thus not affect the rated power transfer from the transmitter to the receiver. In one embodiment, the test frequency is less than 4% different from the operating frequency.

The system is then allowed to reach a steady state under the new frequency. The sensor measures the average steady state current being supplied to the converter. The controller stores this current value in memory as well as the value of the test frequency.

The above step is repeated for a plurality of test frequencies over a range of frequencies. Those skilled in the art will appreciate that this then results in the memory having a record of currents measured over a range of frequencies. In a preferred embodiment, the range of frequencies is selected so as to be generally centred about the operating frequency of the transmitter.

Figure 4:
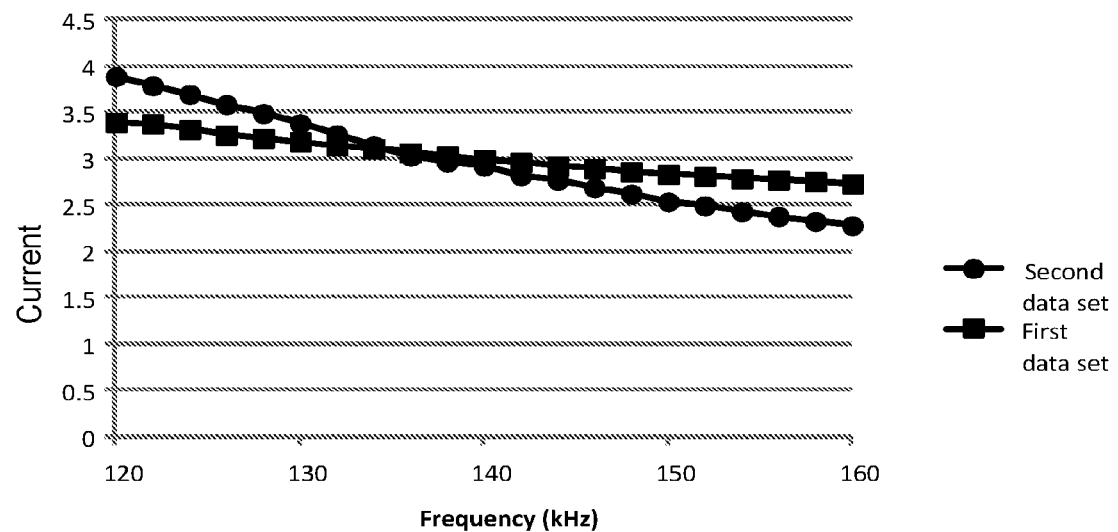

The controller then analyses the record to determine the relationship between the steady state current and test frequencies. The controller determines the relationship by any suitable method of function analysis. The controller may be configured to smooth or average the data to improve the quality of the analysis. In a preferred embodiment, the controller performs linear regression analysis of the data to determine the proportionality constant. FIG. 4 shows two example sets of data with current on the vertical axis and frequency on the horizontal axis. In the first data set, it can be seen that there is slight variation, but generally the slope of the data is close to zero, ie the proportionality constant is, or is near, zero. Conversely, the second data set shows a much more negative slope ie the proportionality constant is more negative.

If a receiver is present, then the receiver will behave as a constant power load, and thus slight variations in driving frequency will not affect the amount of power being drawn. Therefore, the current being drawn by the converter will not vary significantly. Conversely, a conducting non-receiver (such as a piece of metal) will behave as a constant resistance load, and thus for a transmitter coil being driving at a constant voltage, slight increases in driving frequency will decrease the amount of power being drawn. Therefore, the current flowing into the converter will also decrease.

It will be appreciated that the proportionality constant described above can thus be used as an indicator as to the presence of a conducting non-receiver. The controller may be calibrated so that only a proportionality constant with a value less than a certain threshold (ie being 'sufficiently negative') is regarded as being indicative as to the presence of a conducting non-receiver.

If the controller determines that the proportionality constant is not sufficiently negative, then there is a likelihood that a conducting non-receiver may not be in the range of the transmitter, and thus the controller may then:
  control the transmitter so that power is transferred to the receiver.

If the controller determines that the proportionality constant is sufficiently negative, then there is a likelihood that a conducting non-receiver (ie a parasitic load) may be in the range of the transmitter, and thus the controller may then:
  control the transmitter according to further detection methods to confirm the presence of a conducting non-receiver;
  return the transmitter to the previously described standby mode; or
  switch the transmitter off Voltage Vary Detection Method According to one embodiment of the invention, the voltage vary detection method begins with the transmitter in a power mode. In one embodiment, the transmitter has already detected the presence of a receiver and has commenced transferring power to the receiver. In the power mode, the transmitter is controlled to transfer power to a receiver. The DC-AC converter and DC-DC converter will be controlled to supply an alternating current to the inductor at an operating voltage and an operating frequency.

Periodically the transmitter switches from the power mode to a power-detection mode to detect whether a conducting non-receiver (ie a parasitic load has been introduced into the range of the transmitter. In a preferred embodiment of the invention, the transmitter is configured to temporarily switch into the power-detection mode every 2 seconds.

Upon switching into a power-detection mode, the sensor measures the average steady state current being supplied to the converter. The controller stores this current value in memory as well as the value of the operating voltage.

The controller then adjusts the voltage to a test voltage. In one embodiment, this is achieved through control of the DC-DC converter. In another embodiment, the converter may be driven at a different duty cycle to change the drive voltage. The test voltage should be sufficient close to the operating voltage as to not affect the rated power transfer from the transmitter to the receiver. In one embodiment, the test voltage is less than 4% different from the operating voltage.

The system is then allowed to reach a steady state under the new voltage. The sensor measures the average steady state current being supplied to the converter. The controller stores this current value in memory as well as the value of the test voltage.

The above step is repeated for a plurality of test voltages over a range of voltages. Those skilled in the art will appreciate that this then results in the memory having a record of currents measured over a range of voltages. In a preferred embodiment, the range of voltages is selected so as to be generally centred about the operating voltage of the transmitter.

Figure 5:
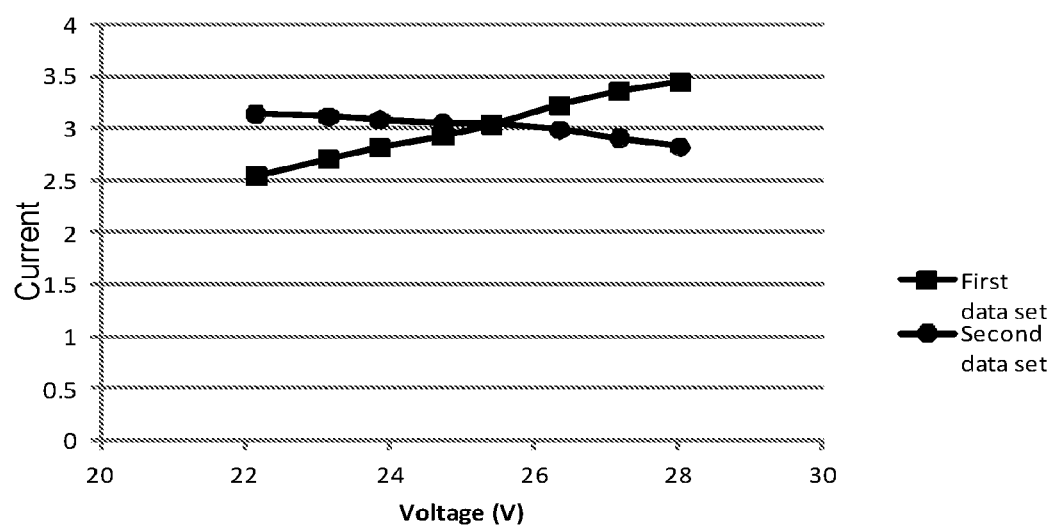

The controller then analyses the record to determine the relationship between the steady state current and test voltage. The controller determines the relationship by any suitable method of function analysis. The controller may be configured to smooth or average the data to improve the quality of the analysis. In a preferred embodiment, the controller performs linear regression analysis of the data to determine the proportionality constant. FIG. 5 shows two example sets of data with current on the vertical axis and voltage on the horizontal axis. In the first data set, it can be seen that there is a positive slope, ie the proportionality constant is positive. Conversely, the second data set shows a negative slope ie the proportionality constant is negative.

If a receiver is present, then the receiver will behave as a constant power load, and thus slight increases in driving voltage will not affect the amount of power being drawn. Therefore, the current being drawn by the converter will decrease as applied voltage increases. (cf P=VI). Conversely, a conducting non-receiver (such as a piece of metal) will behave as a constant resistance load, and thus slight increases in driving voltage will increases the amount of power being drawn. Therefore, the current flowing into the converter will also increase (cf I=V/R).

It will be appreciated that the proportionality constant described above can thus be used as an indicator as to the presence of a conducting non-receiver. The controller may be calibrated so that only a proportionality constant with a value above a certain threshold (ie being 'sufficiently positively') is regarded as being indicative as to the presence of a conducting non-receiver.

If the controller determines that the proportionality constant is not sufficiently positive, then there is a likelihood that a conducting non-receiver may not be in the range of the transmitter, and thus the controller may then:

control the transmitter so that power is transferred to the receiver.

If the controller determines that the proportionality constant is sufficiently positive, then there is a likelihood that a conducting non-receiver (ie a parasitic load) may be in the range of the transmitter, and thus the controller may then:

control the transmitter according to further detection methods to confirm the presence of a conducting non-receiver;

return the transmitter to the previously described standby mode; or switch the transmitter off.

While the present invention has been illustrated by the description of the embodiments thereof, and while the embodiments have been described in detail, it is not the intention of the Applicant to restrict or in any way limit the scope of the appended claims to such detail. Additional advantages and modifications will readily appear to those skilled in the art. Therefore, the invention in its broader aspects is not limited to the specific details, representative apparatus and method, and illustrative examples shown and described. Accordingly, departures may be made from such details without departure from the spirit or scope of the Applicant's general inventive concept.

The invention claimed is:

1. A method for detecting a receiver in an inductively coupled power transfer system having:

a coil for generating an alternating magnetic field;

a converter for supplying an alternating current to the coil; and a sensor for measuring an indication of the current supplied by the converter;

the method comprising:

operating the converter in a power delivery mode to deliver power to an inductive power receiver via the coil;

switching the converter to a power detection mode for detecting inductive power receivers or parasitic loads while transferring power, wherein the power detection mode comprises:

operating the converter so as to vary at least one of a voltage or frequency of alternating current supplied to the coil to a plurality of test voltages or test frequencies;

using the sensor, detecting a change in current supplied to the coil associated with the varying of at least one of the voltage or frequency of alternating current supplied to the coil to the plurality of test voltages or test frequencies;

performing a regression analysis of the change in current associated with the plurality of test voltages or test frequencies to determine a proportionality constant relating the change in current to the variation of at least one of a voltage or frequency of alternating current supplied to the coil; and detecting a receiver or a parasitic load based on the proportionality constant satisfying one or more predetermined parameters.

2. The method of claim 1 wherein operating the converter so as to vary at least one of a voltage or frequency supplied to the coil comprises adjusting the frequency to one or more test frequencies.

3. The method of claim 2 wherein each of the one or more test frequencies is less than 4% different than an operating frequency in the power delivery mode.

4. The method of claim 2 wherein:

detecting a change in current supplied to the coil comprises:

measuring average steady state current supplied at the power delivery frequency;

storing the measured average steady state current and associated power delivery frequency;

measuring average steady state current supplied at the one or more test frequencies; and storing the measured average steady state current and associated test frequencies;

and wherein performing a regression analysis of the change in current comprises:

determining a relationship between steady state current and frequency.

5. The method of claim 2, further comprising: detecting a receiver based on the proportionality constant being greater than a threshold.

6. The method of claim 2, further comprising: detecting a parasitic load based on the proportionality constant being less than a threshold.

7. The method of claim 1 wherein operating the converter so as to vary at least one of a voltage or frequency supplied to the coil comprises adjusting the voltage to one or more test voltages.

8. The method of claim 7 wherein each of the one or more test voltages is less than 4% different than an operating voltage in the power delivery mode.

9. The method of claim 7 wherein:

detecting a change in current supplied to the coil comprises:

measuring average steady state current supplied at the power delivery voltage;

storing the measured average steady state current and associated power delivery voltage;

measuring average steady state current supplied at the one or more test voltages; and storing the measured average steady state current and associated test voltages;

and wherein performing a regression analysis of the change in current comprises:

determining a relationship between steady state current and voltage.

10. The method of claim 7, further comprising: detecting a receiver based on the proportionality constant being less than a threshold.

11. The method of claim 7, further comprising: detecting a parasitic load based on the proportionality constant being greater than a threshold.

12. The method of claim 1, further comprising in accordance with detecting a receiver based on the proportionality constant satisfying a predetermined parameter, transmitting wireless power to the receiver.

13. The method of claim 1, further comprising, in accordance with detecting a receiver based on the proportionality constant satisfying a predetermined parameter, identifying whether the receiver is a receiver that is compatible with the inductively coupled power transfer system.

14. The method of claim 1, further comprising, in accordance with detecting a receiver based on the proportionality constant satisfying a predetermined parameter, switching a transmitter of the system to a standby mode.

15. The method of claim 1, further comprising, in accordance with detecting a receiver based on the proportionality constant satisfying a predetermined parameter, switching a transmitter of the system off.

16. An inductive power transmitter comprising:
a coil for generating an alternating magnetic field;
a converter for supplying an alternating current to the coil;
a sensor for measuring an indication of the current supplied by the converter; and
a controller configured to:
operate the converter in a power delivery mode to deliver power to an inductive power receiver via the coil;
switch the converter to a power detection mode for detecting inductive power receivers or parasitic loads while transferring power, wherein, in the power detection mode, the controller is configured to:
operate the converter so as to vary at least one of a voltage or frequency of alternating current supplied to the coil to a plurality of test voltages or test frequencies;
using the sensor, detecting a change in current supplied to the coil associated with the varying of at least one of the voltage or frequency of alternating current supplied to the coil to the plurality of test voltages or test frequencies;
perform a regression analysis of the change in current associated with the plurality of test voltages or test frequencies to determine a proportionality constant relating the change in current to the variation of at least one of a voltage or frequency of alternating current supplied to the coil; and
detect a receiver or a parasitic load based on the proportionality constant satisfying one or more predetermined parameters.

17. The inductive power transmitter of claim 16 wherein the controller is configured to operate the converter so as to vary at least one of a voltage or frequency supplied to the coil by adjusting the frequency to one or more test frequencies.

18. The inductive power transmitter of claim 17 wherein each of the one or more test frequencies is less than 4% different than an operating frequency in the power delivery mode.

19. The inductive power transmitter of claim 17 wherein:
the controller is configured to detect a change in current supplied to the coil by:
measuring average steady state current supplied at the power delivery frequency;
storing the measured average steady state current and associated power delivery frequency;
measuring average steady state current supplied at the one or more test frequencies; and
storing the measured average steady state current and associated test frequencies;
and wherein the controller is configured to perform a regression analysis of the change in current to determine a relationship between steady state current and frequency.

20. The inductive power transmitter of claim 17, wherein the controller is further configured to detect a receiver based on the proportionality constant being greater than a threshold.

21. The inductive power transmitter of claim 17, wherein the controller is further configured to detect a parasitic load based on the proportionality constant being less than a threshold.

22. The inductive power transmitter of claim 16 wherein operating the converter so as to vary at least one of a voltage or frequency supplied to the coil comprises adjusting the voltage to one or more test voltages.

23. The inductive power transmitter of claim 22 wherein each of the one or more test voltages is less than 4% different than an operating voltage in the power delivery mode.

24. The inductive power transmitter of claim 22 wherein:
the controller is configured to detect a change in current supplied to the coil by:
measuring average steady state current supplied at the power delivery voltage;
storing the measured average steady state current and associated power delivery frequency;
measuring average steady state current supplied at the one or more test frequencies; and
storing the measured average steady state current and associated test frequencies;
and wherein the controller is configured to perform a regression analysis of the change in current to determine a relationship between steady state current and voltage.

25. The inductive power transmitter of claim 22, wherein the controller is further configured to detect a receiver based on the proportionality constant being greater than a threshold.

26. The inductive power transmitter of claim 22, wherein the controller is further configured to detect a parasitic load based on the proportionality constant being greater than a threshold.

27. The inductive power transmitter of claim 16, wherein the controller is further configured to, in accordance with detecting the receiver based on the proportionality constant satisfying a predetermined parameter transmit wireless power to the receiver.

28. The inductive power transmitter of claim 16, wherein the controller is further configured to in accordance with detecting the receiver based on the proportionality constant satisfying a predetermined parameter identify whether the receiver is a receiver that is compatible with the inductively coupled power transfer system.

29. The inductive power transmitter of claim 16, wherein the controller is further configured to, in accordance with detecting the receiver based on the proportionality constant satisfying a predetermined parameter, switch the transmitter to a standby mode.

30. The inductive power transmitter of claim 16, wherein the controller is further configured to, in accordance with detecting the receiver based on the proportionality constant satisfying a predetermined parameter, switch the transmitter off.

* * * * *